United States Patent [19]

Novosel et al.

[11] Patent Number: 4,801,891
[45] Date of Patent: Jan. 31, 1989

[54] DIFFERENTIAL AMPLIFIER UTILIZING MOS TRANSISTORS OF A SINGLE CHANNEL POLARITY

[75] Inventors: David Novosel, New Wilmington, Pa.; Alejandro de la Plaza, Buenos Aires, Argentina

[73] Assignee: SGS Microelettronica S.p.A., Catania, Italy

[21] Appl. No.: 110,891

[22] Filed: Oct. 21, 1987

[30] Foreign Application Priority Data

Oct. 21, 1986 [IT]  Italy ............................... 83653 A/86

[51] Int. Cl.$^4$ ............................................... H03F 3/45
[52] U.S. Cl. ..................................... 330/253; 330/261
[58] Field of Search ............... 330/252, 253, 259, 260, 330/261

[56] References Cited

U.S. PATENT DOCUMENTS 4,760,286  7/1988  Pigott .................................. 330/261

Primary Examiner—Gene Wan
Attorney, Agent, or Firm—Pollock, Vande Sande & Priddy

[57] ABSTRACT

A voltage differential amplifier made with MOS transistors of a single channel polarity and using only two additional transistors besides a differential input pair is exceptionally exempt of problems caused by the normal spread of the parameters of the real components forming the bias current generators of the differential pair.

1 Claim, 1 Drawing Sheet

DIFFERENTIAL AMPLIFIER UTILIZING MOS TRANSISTORS OF A SINGLE CHANNEL POLARITY

The present invention relates generally to differential amplifiers circuits and more specifically to differential voltage amplifiers utilizing enhancement type MOS transistors in a monolithically integrated circuit.

A basic differential amplifier usually includes two identical transistors, commonly denominated "differential pair", with their gates connected, respectively, to the two input terminals of the amplifier, their sources connected in common to an internal node of the amplifier and their drains connected, respectively, to the two output terminals. The circuit also includes two identical current generators connected between each drain of the differential pair and a first common potential node ($V_{dd}$) and a third current generator connected between the sources of the differential pair (i.e. said internal node) and a second common potential node ($V_{ss}$). The three current generators having the purpose of determining the operating point on the voltage-current characteristic curve of the two transistors of the differential pair.

A typical example of such a circuit is shown in FIG. 1, wherein the differential pair (often also referred to as input pair) is composed of transistors $M_1$ and $M_2$, which are, respectively, associated with the biasing constant current generators $I_1$ and $I_2$. The third current generator $I_3$ must generate a constant current equal to the sum of the currents generated by the current generators $I_1$ and $I_2$ for a correct operation of the amplifier.

Such a circuit is theoretically capable of operating as a differential amplifier generating an output current proportional to the difference of the voltages applied to the two inputs IN+ and IN− of the circuit. However, such a circuit cannot be used in practice because its correct operation presumes ideal conditions which cannot be ensured by state-of-the-art fabrication processes of the integrated circuit.

In fact, the currents delivered by the individual current generators may depart significantly from their design value due to the inevitable spread of the values of the intrinsic parameters of distinct integrated semiconductor devices, typical of the particular fabrication process.

Furthermore, the current generators are implemented utilizing transistors of various types using normal techniques well known in the art and the output resistance of such current generators will have a finite though very high value.

On the other hand, the above remarked condition: $I_1+I_2=I_3$ imposes a very severe restraint. In particular, if the current generator $I_3$ delivers a current different from such a design value ($I_3=I_1+I_2$), the circuit, although finding a proper equilibrium condition, is such that the operating point of the transistors of the differential pair will change significantly from the design one, thus rendering the circuit inoperative.

Figure 1:
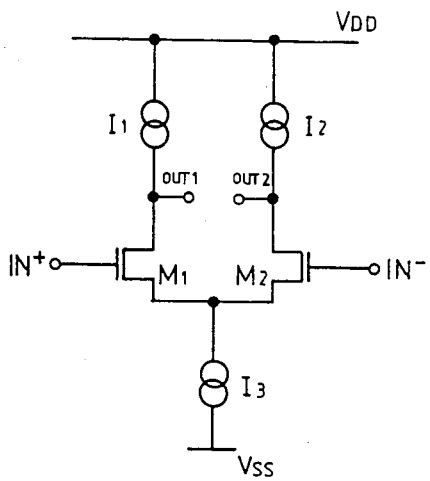
FIG. 1 is differential amplifier of the prior art

Thus, in practice, it is necessary to add other circuit elements to such an ideal circuit of FIG. 1 in order to build an operative differential amplifier with real components.

A discussion of this problems and the proposal of a circuit for an operational amplifier capable of making the real amplifier insensitive to shifts of the values of the intrinsic parameters of the different elements or integrated components from their design value is presented in the article:

"A Process Insensitive NMOS Operational Amplifier" by Y. P. Tsiuidis and D. Fraser, from *Digest of Technical Papers* of 1979 International Solid State Circuits Conference—Philadelphia, Pa., February 1979".

Although the circuit described in the above mentioned article is perfectly operable and efficient, it requires six transistors and four distinct bias current generators.

On the other hand, the constant quest for an ever increasing "compaction" of monolithically integrated systems imposes implementation of functions using the least number of components as practical.

An object of the present invention is to provide a voltage differential amplifier made with a minimum number of active components and capable of operating satisfactorily in presence of significant shifts, in respect to the design values, of the currents generated by the bias current generators of the circuit.

This and other objects and advantages are obtained by the voltage differential amplifier of the instant invention which may be implemented in MOS technology and utilizes only two additional transistors besides the differential pair though being exceptionally exempt from problems caused by the normal spread in the parameters of the real components forming the circuit and forming the bias current generators.

Essentially, such a desired condition is obtained by adding to the basic circuit of an ideal voltage differential amplifier depicted in FIG. 1, only two MOS transistors having their gates and sources connected, respectively, to the gates and to the sources of the basic differential pair of transistors and having their drains connected to a common potential node of the circuit.

For example, a voltage differential amplifier according to the invention, made with n-channel MOS transistors, comprises:

a pair of input MOS transistors each having a gate, a drain and a source;

the gates of said input MOS transistors being connected, respectively, to one and to the other of two input terminals;

the sources of said input MOS transistors being connected to an internal node of the circuit;

the drains of said input MOS transistors being connected, respectively, to one and to the other of two output terminals;

a first and a second bias current generators each having a positive terminal and a negative terminal, with electric current conventionally flowing internally of the generator from said positive terminal to said negative terminal, the positive terminals thereof being connected to a first common potential node of the circuit and their negative terminal being connected, respectively, to one and to the other of said output terminals;

a third bias current generator having a positive terminal and a negative terminal, with electric current conventionally flowing inside the generator from said positive terminal to said negative terminal and generating a current equal to or greater than the sum of the currents generated by said first and second current generators, the positive terminal being connected to said internal node of the circuit and the negative terminal being connected to a second common potential node of the circuit;

two additional bias MOS transistors each having a gate, a drain and a source;

the gate and the source of each of said two additional bias MOS transistors being respectively connected to the gate and to the source of one and of the other of said two input MOS transistors;

the drains of said two additional bias MOS transistors being connected to said first common potential node of the circuit.

Figure 2:
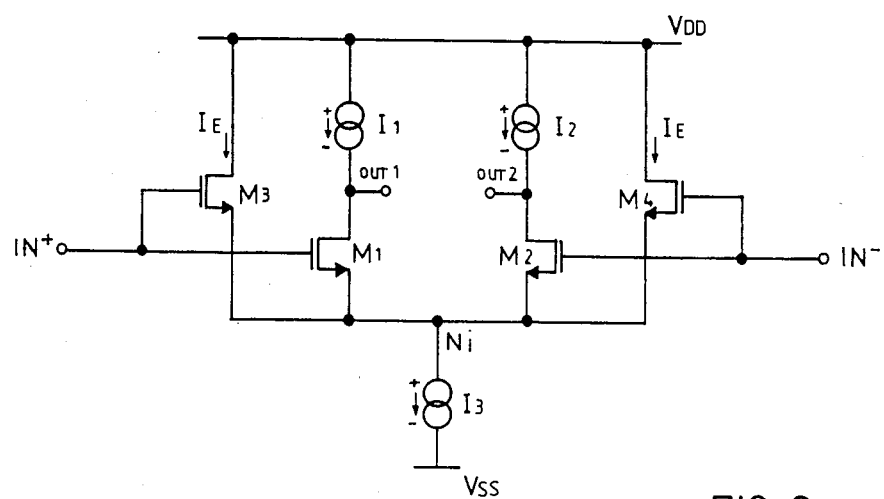
FIG. 2 is a drawing of the differential amplifier of the present invention

The circuit diagram of the voltage differential amplifier of the invention is shown in FIG. 2. The pair of input MOS transistors is represented by the transistors $M_1$ and $M_2$. The output terminals are indicated by $OUT_1$ and $OUT_2$ and the input terminals are indicated by $IN+$ and $IN-$. The internal node is indicated with Ni. The three current generators employed by the circuit are respectively indicated with $I_1$, $I_2$ and $I_3$. The two additional bias MOS transistors are indicated with $M_3$ and $M_4$. Said first common potential node of the circuit is indicated with Vdd and said second common potential node of the circuit is indicated with Vss.

As may be easily observed by comparing the two figures, the transistors $M_1$ and $M_2$ and the current generators $I_1$, $I_2$ and $I_3$ constitute essentially the basic circuit of FIG. 1 (idealized voltage differential amplifier) and the two additional bias transistors $M_3$ and $M_4$ are the only devices added to such a basic circuit.

Of course the two transistors $M_1$ and $M_2$ forming the differential input pair of the amplifier are substantially identical transistors and both the first and the second current generators $I_1$ and $I_2$ generate a constant bias current equal to a certain design value $I_0$.

The third current generator $I_3$ is designed so as to generate a current:
$$I_3 = 2 \times (I_0 + I_e)$$
where $I_e$ is a certain current which is absorbed by the two additional bias transistors $M_3$ and $M_4$.

The two additional bias transistors $M_3$ and $M_4$, are also preferably two identical transistors.

It is possible to indicate the drain current (Idn) at the operating point (i.e. at the bias conditions) of any one (Mn) of the four transistors of the circuit by means of the following equations:
$$Id_1 = Id_2 = I_0$$
$$Id_3 = Id_4 = I_e$$

As it may be recognized easily from the above noted equations, in contrast to the basic circuit depicted in FIG. 1, the circuit of the invention does not impose any particularly severe restraint to the values of the bias currents. This confirms that the circuit of the invention will operate correctly also when such values of the bias currents depart from their respective design value because of the spread in the parameters typical of the particular fabrication process.

The only requisite for the current generators being that the value of the current $I_e$ absorbed by the two additional bias transistors $M_3$ and $M_4$ be always positive.

In practice, the third current generator $I_3$ may be designed so that it outputs a current greater than the sum of the currents $I_1$ and $I_2$ (e.g. greater than $2I_0$) generated by the first and second current generators so as to ensure absorption of a certain current $I_e$ by the two additional bias transistors $M_3$ and $M_4$. This provision effectively eliminates the need (critical condition) of ensuring that the third current generator $I_3$ generate a current equal to the sum of the currents generated by the first and second current generators $I_1$ and $I_2$, as it was necessary according to the prior art. This achievement being made possible by employing only two additional transistors.

The circuit of the voltage differential amplifier of the instant invention can be made also with p-channel MOS transistors by inverting all the polarities of the circuit.

The voltage differential amplifier of the invention is particularly suited as a transconductance stage (input stage) of operational amplifiers ("internal amplifiers" or "output buffers"), of voltage comparators, etc..

As will be evident to the skilled technician, different embodiments of the voltage differential amplifier of the invention can be made, particular embodiments of the current generators using transistors, resistors or other circuit elements being clearly within the scope of the present invention.

What we claim is:

1. A voltage differential amplifier comprising:

a pair of input MOS transistors each having a gate, a drain and a source;

the gates of said input MOS transistors being connected, respectively, to one and to the other of two input terminals;

the sources of said input MOS transistors being connected to a internal node of the amplifier;

the drains of said input MOS transistors being connected, respectively, to one and to the other of two output terminals;

a first and a second bias current generator each having a positive and a negative terminal, with current flowing inside the generator from said positive terminal to said negative terminal, said current generators being connected with their terminal of a first polarity to a first common voltage node and with their terminal of opposite polarity, respectively, to one and to the other of said output terminals;

a third bias current generator having a positive terminal and a negative terminal, with current-flowing inside the generator from said positive terminal to said negative terminal and generating a current equal to or greater than the sum of the currents generated by said first and second current generators, the terminal of said first polarity being connected to said internal node of the amplifier and the terminal of opposite polarity being connected to a second common potential node of the amplifier;

two additional bias MOS transistors each having a gate, a drain and a source;

the gate and the source of each of said two additional bias MOS transistors being respectively connected to the gate and to the source of one and of the other of said two input MOS transistors;

the drains of said two additional bias MOS transistors being connected to said first common potential node of the amplifier.

* * * * *